United States Patent
Sato

(10) Patent No.: US 7,472,206 B2
(45) Date of Patent: Dec. 30, 2008

(54) METHOD AND APPARATUS OF COMMUNICATION CONTROL USING DIRECT MEMORY ACCESS (DMA) TRANSFER

(75) Inventor: Mikio Sato, deceased, late of Kawasaki (JP); by Kyoko Sato, legal representative, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 203 days.

(21) Appl. No.: 11/463,357

(22) Filed: Aug. 9, 2006

(65) Prior Publication Data

US 2007/0129824 A1 Jun. 7, 2007

(30) Foreign Application Priority Data

Aug. 15, 2005 (JP) .............................. 2005-235491

(51) Int. Cl.
*G06F 13/10* (2006.01)
*G01R 31/00* (2006.01)

(52) U.S. Cl. .......................................... 710/22; 438/14
(58) Field of Classification Search ................... 710/22; 355/53, 55
See application file for complete search history.

(56) References Cited

U.S. PATENT DOCUMENTS

| | | | | |
|---|---|---|---|---|
| 4,653,903 A | * | 3/1987 | Torigoe et al. ................ | 355/53 |
| 4,941,980 A | * | 7/1990 | Halavee et al. ............... | 250/310 |
| 5,083,258 A | | 1/1992 | Yamasaki | |
| 5,286,963 A | * | 2/1994 | Torigoe ................... | 250/201.2 |
| 5,703,454 A | | 12/1997 | Taguchi | |
| 6,473,780 B1 | * | 10/2002 | Barcelo ....................... | 718/103 |
| 2003/0097481 A1 | | 5/2003 | Richter | |
| 2005/0038949 A1 | | 2/2005 | Patterson | |
| 2005/0128453 A1 | * | 6/2005 | Miura ......................... | 355/55 |

FOREIGN PATENT DOCUMENTS

| | | |
|---|---|---|
| EP | 0 825 539 A2 | 2/1998 |
| JP | 05-343501 | 12/1993 |
| JP | 07-110975 A | 4/1995 |
| JP | 2000-228342 A | 8/2000 |
| JP | 2001-057380 | 2/2001 |
| WO | WO 02/101566 A2 | 12/2002 |

\* cited by examiner

*Primary Examiner*—Henry W. H. Tsai
*Assistant Examiner*—Hyun Nam
(74) *Attorney, Agent, or Firm*—Cowan, Liebowitz & Latman, P.C.

(57) ABSTRACT

A switched fabric is provided in a digital control system and data communication is performed using DMA transfer. A communication control unit is provided for controlling the switched fabric. The communication control unit determines the priorities of data to be transferred according to their types. When the communication control unit receives a request for higher-priority DMA transfer during DMA transfer, it suspends the current DMA transfer and performs the higher-priority DMA transfer. After completion of the higher-priority DMA transfer, the communication control unit resumes the suspended DMA transfer.

11 Claims, 11 Drawing Sheets

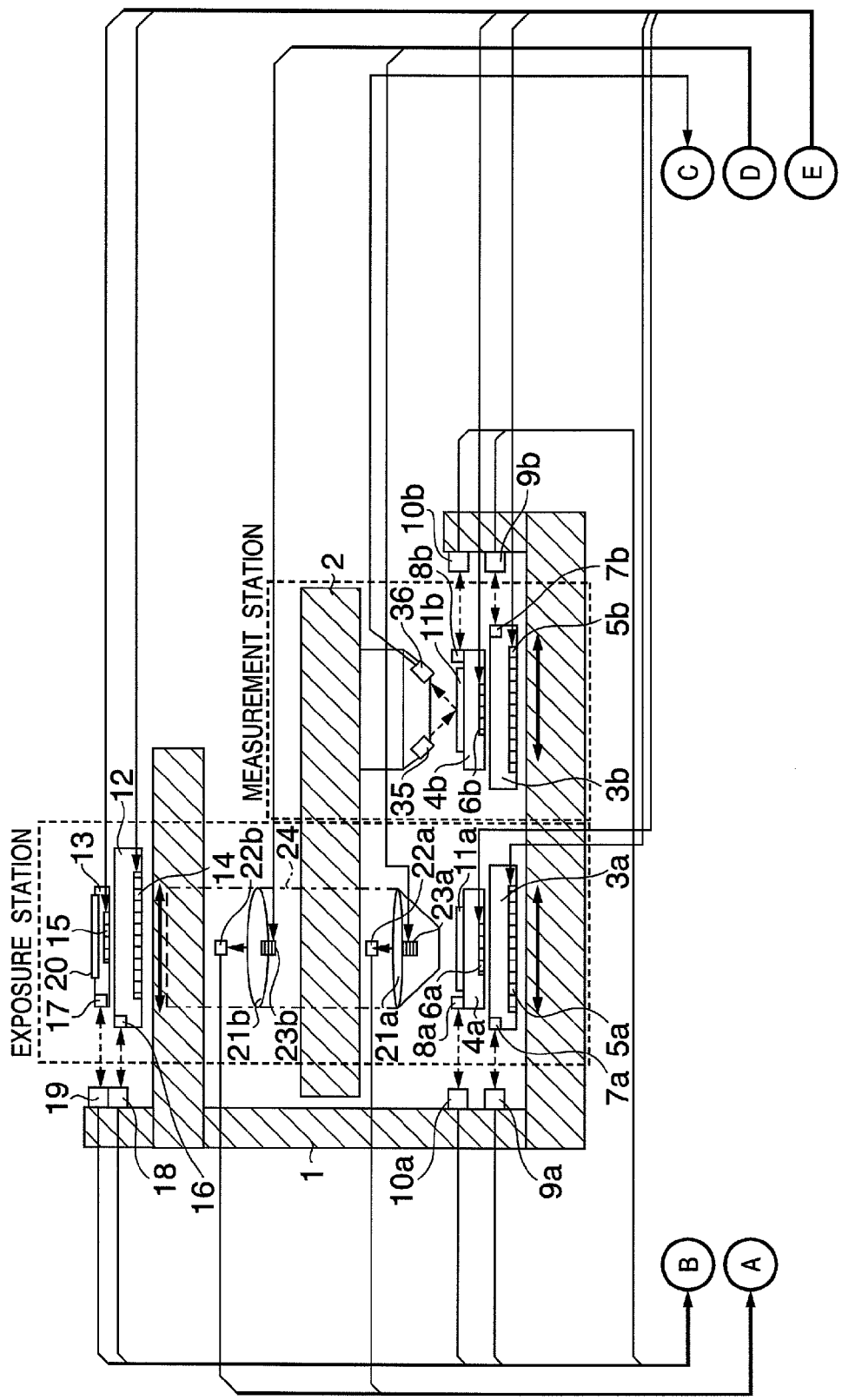

METHOD AND APPARATUS OF COMMUNICATION CONTROL USING DIRECT MEMORY ACCESS (DMA) TRANSFER

BACKGROUND OF THE INVENTION

1. Field of the Invention

The present invention relates to a digital data communication control technique in an apparatus such as an exposure apparatus.

2. Description of the Related Art

The dramatic development of semiconductor device technology in recent years has propelled significant improvements of the performance of various information apparatuses containing semiconductor devices. The development is supported by semiconductor manufacturing technology. Semiconductors are typically manufactured by using a semiconductor exposure apparatus called a stepper or scanner.

A stepper reduces an image of a pattern formed on a reticle and projects it onto a semiconductor wafer placed on a wafer stage under a projection lens to transfer pattern images onto multiple parts of the single wafer one after another through exposure while moving the wafer stepwise.

A scanner irradiates a semiconductor wafer placed on a wafer stage and a reticle placed on a reticle stage with a slit-shaped exposure light ray to project a pattern image formed on the reticle onto the wafer while moving (scanning) the semiconductor wafer and the reticle with respect to a projection lens.

The scanner is in widespread use as an exposure tool for a semiconductor device today because it surpasses the stepper in resolution and overlay accuracy. In the scanner, the wafer stage and reticle stage must be controlled to bring them into synchronization with each other with high accuracy. For this purpose, a digital control system is provided in the scanner.

The digital control system requires "hard realtime" capability, which is the capability to perform control interrupt processing at predetermined sampling periods without fail. In order to scan the wafer stage and the reticle stage with high synchronization accuracy, the scanner requires a multi-axis digital control system capable of providing multiaxial (e.g., more than 20 axes) control.

Furthermore, the control sampling periods significantly affects control performance. Therefore, it is desirable that the periods be as short as possible. The scanner requires control sampling periods of the order of 100 microseconds. Such a multiaxial fast control system is typically implemented by a digital control system with a multiprocessing configuration using multiple DSPs (Digital Signal Processors).

In addition to the hard realtime capability, the digital control system must have the capability of receiving a command from a user, providing the command to each DSP, and presenting the result of the execution of the command to the user. Furthermore, the digital control system must include "host capabilities" such as the capability of presenting a graphical representation of the status of a controlled object. User commands includes commands to activate and deactivate servo operation of a controlled object, to move a controlled object, and to change control parameters.

Processors that are specially designed for signal processing such as DSPs are not suitable for implementing these host capabilities. RISC CPUs, which are suitable for implementing host capabilities, are often used. Desirably, hardware that implements the host capabilities may be hardware on which a versatile OS having host-program library resources such as graphical user interface and TCP/IP functions can be run without needing porting. Therefore, general-purpose processor boards using basically a standard multi-drop bus such as a VME bus are widely used as the hardware that implements host capabilities. The general-purpose processor board enables efficient development of software for host capabilities exploiting various libraries of a versatile OS on the basis of hardware-dependent firmware provided by board manufacturers.

In order to implement a fast digital control system, fast control data communications between processors and between the processors and I/O devices (such as sensors and D/A converters) must be provided in addition to the fast throughput of control processors.

In order to transfer control data required for such control processing, typically it is desirable to use DMA transfer. This is because the DMA transfer is advantageous in that: (1) it does not place a significant load on processors during data transfer, and (2) it is faster than non-DMA transfer.

However, among the multi-drop buses, VME buses, which are widely used in the field of industrial machinery, provides a low bus-transfer rate and does not have the DMA transfer function, therefore is not suitable for control data communication in servo systems. Furthermore, multi-drop buses, including VME busses, are inherently incapable of providing multiple communications concurrently. When control computation processing that requires high hard-realtime performance is distributed among multiple DSPs, data communication waiting time occurs due to a low transfer rate or bus occupation. As a result, data communication becomes a bottleneck of the entire system.

Therefore, specialized communication ports of DSPs are used to provide fast control data communications between the processors and between the processors and I/O devices, thereby eliminating the bottleneck relating to data communication.

FIG. 1 shows an exemplary configuration of a conventional digital control system in an exposure apparatus using multiple DSPs. In FIG. 1, the solid arrows represent control data communication performed at every control sampling period and the dashed arrows represent command data communications by a host capability performed in response to commands from a user.

In command data communication, command data from a host CPU of a host apparatus is transferred to DSP 1 through a bus such as a VME bus and provided from DSP 1 to DSP 2 and DSP 3. Then, each DSP perform processing according to the command data.

In control data communication, positional information about a controlled object is detected by a sensor in every control sampling period and transferred to DSP 2. The sensor data is communicated between DSPs to perform control computations such as target position, position deviation, and PID computations. The calculated values are transferred to a D/A converter through DSP 2. In the communication between the DSPs and between the DSPs and I/O devices, data are transferred through communication ports of the DSPs. The control computation processing is usually performed by using a hardware interrupt function of the DSPs in every control sampling period.

FIG. 2 shows timing of data communication and computation processing performed by processors according to the conventional art described with reference to FIG. 1. As time progresses as indicated by the downward arrow in FIG. 2, the processors synchronously perform processing.

With reference to FIG. 2, command data processing will be first described. The host CPU generates command data in response to a command from a user and sends the command data to DSP 1. DSP 1 transfers the command data to DSP 2 or DSP 3 (in this example, DSP 2), depending on the content of the command data. DSP 2 changes the status of a servo system to be dealt with in DSP 2 according to the received command data and returns reply data to DSP 1 waiting for the reply data from DSP 2. Similarly, DSP 1 returns reply data to the host CPU waiting for the reply data. With this process, processing for the single command is completed.

The command processing in DSP 2 and DSP 3 is performed during time periods other than interrupt processing time periods for control computation. Depending on the amount of computation for command processing, the command processing is separated into multiple parts by sandwiching interrupt processings as indicated by symbols "a" and "b" in FIG. 2. Japanese Patent Laid-Open No. H7-110975 discloses an example of the technique for performing servo operation by interrupt processing and performing other processing in other time periods.

Interrupt processing, namely control computation processing, shown in FIG. 2 will be described next. In DSP 2 and DSP 3 that perform control computation, the following control interrupt routines are activated at predetermined intervals.

(1) Sensor Data capturing
(2) Filtering to sensors
(3) Calculation of a target position
(4) Calculation of PID
(5) Transfer of the result of computation to D/A converter The series of control computations described above are performed by multiple DSPs in parallel, thereby a digital servo system is configured. This processing must be performed at during every predetermined sampling period.

However, the conventional digital control systems have problems as described below.

In order to increase the throughput of a semiconductor exposure apparatus, a system has been devised in recent years that uses a twin-stage configuration including an exposure station and an alignment station to concurrently perform exposure and alignment measurement. In the system, data obtained by measurement in the alignment station must be transferred to the stage control system in the exposure station in real time to control the leveling of the stage in the exposure station. Accordingly, the amount of data communicated significantly increases compared with other traditional control systems.

With the miniaturization of devices, the need for control of synchronization of optical elements (mirrors and lenses) constituting an imaging optical system with the wafer stage and reticle stage, in addition to the control of those stages, has arisen. The reason is as follows. The attitudes of the optical elements must be controlled in real time in order to suppress aberration of the optical elements with a high precision in the miniaturized devices and the control of the attitude of the optical elements at the same time causes variations of the image focus position on the wafer. These variations must also be corrected in real time.

Thus, the exposure apparatus requires an optical element control system in addition to the stage control system. Furthermore, realtime communication between these control systems is required in order to synchronize the stage control system and the optical element control system.

To achieve such communication, there is a strong demand for a more flexible communication technique for providing fast control data communication between multiple units in a control system of an exposure apparatus. However, it is difficult to implement such a fast and complex communication capability by using fixed, one-to-one communication which is inherent in DSP used in the conventional digital control system described above.

Instead of the fixed, one-to-one communication, multiple control data communications may be performed through a multidrop bus. However, multiple communications cannot be performed at a time through the bus and therefore communication wait time occurs due to bus occupation. Furthermore, it is difficult to contain a stage control system including an optical element control system and an alignment measurement system in a single multidrop-bus-based chassis because of a limited number of slots.

In recent years, interconnect communication technologies such as RapidIO and PCI-EXPRESS for inter-processor communication and I/O communication have rapidly developed. At the core of the development are the advances in fast communication technologies of the order of gigabits.

FIGS. 3A and 3B show exemplary communication topologies using a switched-fabric switching circuit. In FIGS. 3A and 3B, processors 1-4 and I/O devices 1-4 are connected onto a switched fabric. The interconnections between the I/O devices and processors connected to the switched fabric can be dynamically switched. For example, the connection topology in FIG. 3A is dynamically changed to the topology shown in FIG. 3B. In both topology, up to four connections can be established concurrently and data transmission can be performed concurrently. Therefore, occurrence of transmission wait time is suppressed as opposed to conventional multidrop bus connections. By changing connections dynamically and fast in this way, desired transfer operation can be performed. The processors (including a processor that implements host capabilities) and I/O devices connected to a switched fabric are collectively called "communication nodes" hereinafter.

The switched-fabric communication technique has been standardized by the IEEE, is being used in industrial and consumer apparatuses, and is becoming less expensive. The technique is also advantageous in that it is faster than the conventional multidrop bus connections, that the bottleneck caused by bus occupation can be eliminated because communication between multiple points can be concurrently performed, and that a flexible system configuration can be implemented because the connection points can be dynamically changed. Furthermore, by distributing the components of the system over multiple racks and interconnecting them through a switched fabric, a larger-scale system can be built compared with conventional multidrop bus systems in which the maximum number of slots that can be provided in a chassis is limited.

For the reasons described above, it is desirable that a switched fabric communication technique be used in a digital control system of an exposure apparatus. This will provide the following effects:

(1) Flexible and fast communication can be provided not only for stage control but also for measurements of wafers and control of optical elements.
(2) Command data communication and control data communication, which have been conventionally performed using different protocols, are integrated into switched fabric communication so that simpler and faster software and hardware can be implemented.

However, an exposure apparatus requires the "hard real-time capability" of performing multi-axis control computation processing at a sampling rate of the order of 100 microseconds in every sampling period. Accordingly, control data input/output communication and communication between processors also must be performed in every control computation processing period of the order of 100 microseconds in such a manner that the digital control computations can be completed in that period.

Therefore, in order to provide a digital control system that can dynamically change connections using the switched fabric communication, switching and control data communication must be completed in a time period sufficiently shorter than the control computing period. The switching and communication must be completed even when communication of a large amount of command data from a user is performed asynchronously.

The hard realtime capability for such communication is a tough condition which is not required by a so-called best-effort multimedia processing system such as digital audio apparatuses free of constraints concerning communication processing or computation processing that must be satisfied.

It is desirable to use DMA transfer in data communication. However, DMA transfer is a transfer method in which data is transferred without interruption until transfer of a desirable amount of data is completed once the transfer is started. Therefore, when a large amount of command data is transmitted in a digital control system implemented by using a switched fabric in which switching between command data communication and control data communication is required, the transfer of command data may not be able to be completed before the next sampling period starts.

The present invention has been made in view of these circumstances and a feature of the present invention is to provide a communication technique that enables fast data communication in a digital control system of an exposure apparatus while ensuring hard realtime capability of the exposure apparatus.

SUMMARY OF THE INVENTION

It is a feature of the present invention to solve the conventional problems.

According to an aspect of the present invention, there is provided with a communication control apparatus in a control apparatus having a measurement unit which measures the position of a controlled object, a driving unit which drives the controlled object, a control processor which computes digital control data for controlling the controlled object according to measured data by the measurement unit, and a host processor which sends command data corresponding to a predetermined command to the control processor; the communication control apparatus comprising:

a transfer unit, adapted to transfer the measured data, the digital control data, and the command data through DMA transfer;

a switching unit, adapted to switch communication channels to the processors through which the measured data, the digital control data, and the command data are transferred, and adapted to switch a communication channel between the processors;

a setting unit, adapted to set, among data transferred through DMA transfer, a higher priority on data transferred at every predetermined sampling period than on data transferred regardless of the predetermined sampling period;

a receiving unit, adapted to receive a DMA transfer request from at least one of the processors;

a communication unit, adapted to initiate data communication through DMA transfer in response to the DMA transfer request;

a comparing unit, adapted to, when a new DMA transfer request is received during the DMA transfer initiated by the communication unit, compares the priority of the data currently being transferred with the priority of data relating to the newly received DMA transfer request; and a transfer control unit, adapted to interrupts the DMA transfer of the data currently being transferred and initiates DMA transfer of new data relating to the newly received DMA transfer request, if the comparison by the comparing unit shows that the priority of the data relating to the newly received DMA transfer request is higher than the priority of the data currently being transferred.

According to another aspect of the present invention, there is provided with an exposure apparatus comprising:

a communication control apparatus according to claim 1;

a projection optical system, adapted to project a pattern from a original onto a substrate and transfers the pattern onto the substrate through exposure; and a stage apparatus, adapted to move and position the original and the substrate relatively to each other; wherein an exposure station, adapted to transfer the pattern from the original onto the substrate through exposure, and a measurement station, adapted to measure positions of the projection optical system and the stage apparatus, are separately provided;

data measured in the measurement station is transferred to the control processor through DMA transfer; and the control processor computes control data for controlling the exposure station by using the measured data.

According to another aspect of the present invention, there is provided with a device manufacturing method comprising the steps of:

exposing a wafer using an exposure apparatus according to claim 6; and developing the wafer.

According to another aspect of the present invention, there is provided with a communication control method in a control apparatus having a measurement unit which measures the position of a controlled object, a driving unit which drives the controlled object, a control processor which computes digital control data for controlling the controlled object according to measured data by the measuring unit, and a host processor which sends command data corresponding to a predetermined command to the control processor; the communication control method comprising:

a transfer step of transferring the measured data, the digital control data, and the command data through DMA transfer;

a switching step of switching communication channels to the processors through which the measured data, the digital control data, and the command data are transferred, and of switching a communication channel between the processors;

a setting step of setting, among data transferred through DMA transfer, a higher priority on data transferred at every predetermined sampling period than on data transferred regardless of the predetermined sampling period;

a receiving step of receiving a DMA transfer request from at least one of the processors;

a communication step of initiating data communication through DMA transfer in response to the DMA transfer request;

a comparing step of, when a new DMA transfer request is received during the DMA transfer initiated in the communication step, comparing the priority of the data currently being transferred with the priority of data relating to the newly received DMA transfer request; and a transfer control step of interrupting the DMA transfer of the data currently being transferred and initiating DMA transfer of new data relating to the newly received DMA transfer request, if the comparison in the comparing step shows that the priority of the data relating to the newly received DMA transfer request is higher than the priority of the data currently being transferred.

According to another aspect of the present invention, there is provided with a computer program executed by a communication control unit, wherein the communication control unit is provided in a control apparatus having a measurement unit which measures the position of a controlled object, a driving unit which drives the controlled object, a control processor which computes digital control data for controlling the controlled object according to measured data by the measuring unit, and a host processor which sends command data corresponding to a predetermined command to the control processor; the computer program comprising:

a transfer step module, adapted to transfer the measured data, the digital control data, and the command data through DMA transfer;

a switching step module, adapted to switch communication channels to the processors through which the measured data, the digital control data, and the command data are transferred, and adapted to switch a communication channel between the processors;

a setting step module, adapted to set, among data transferred through DMA transfer, a higher priority on data transferred at every predetermined sampling period than on data transferred regardless of the predetermined sampling period;

a receiving step module, adapted to receive a DMA transfer request from at least one of the processors;

a communication step module, adapted to initiate data communication through DMA transfer in response to the DMA transfer request;

a comparing step module, adapted to, when a new DMA transfer request is received during the DMA transfer initiated by the communication step module, compare the priority of the data currently being transferred with the priority of data relating to the newly received DMA transfer request; and a transfer control step module, adapted to interrupt the DMA transfer of the data currently being transferred and initiate DMA transfer of new data relating to the newly received DMA transfer request, if the comparison by the comparing step module shows that the priority of the data relating to the newly received DMA transfer request is higher than the priority of the data currently being transferred.

This summary of the invention does not necessarily describe all necessary features so that the invention may also be a sub-combination of these described features.

Further features of the present invention will become apparent from the following description of exemplary embodiments with reference to the attached drawings.

BRIEF DESCRIPTION OF THE DRAWINGS

FIGS. 4A and 4B show a configuration of an exposure apparatus and a digital control system according to the present invention;

DESCRIPTION OF THE EMBODIMENTS

Preferred embodiments of the present invention will be described below with reference to the accompanying drawings.

It should be noted that the embodiments described below are examples of means for implementing the present invention and modifications or changes may be made to them as appropriate in accordance with a configuration or various conditions of apparatuses to which the present invention is applied.

The present invention can be applied to an exposure apparatus described below as well as various other high-precision processing apparatuses, precise measurement apparatus, and methods for manufacturing semiconductor devices using such device manufacturing apparatuses.

As stated above, a feature of the present invention is to provide a communication technique that enables fast data communication in a digital control system of an exposure apparatus while ensuring hard realtime capability of them. The switched fabric communication technique described above may be used in order to increase the speed of data communication and DMA transfer may be used for transferring data. However, they alone are not enough for implementing the hard realtime capability. Embodiments relating to a technique that maintains the hard realtime capability in a digital control system using a switched fabric communication and DMA transfer will be described below.

First Embodiment

<Configuration of the Exposure Apparatus and Digital Control System>

Figure 1:
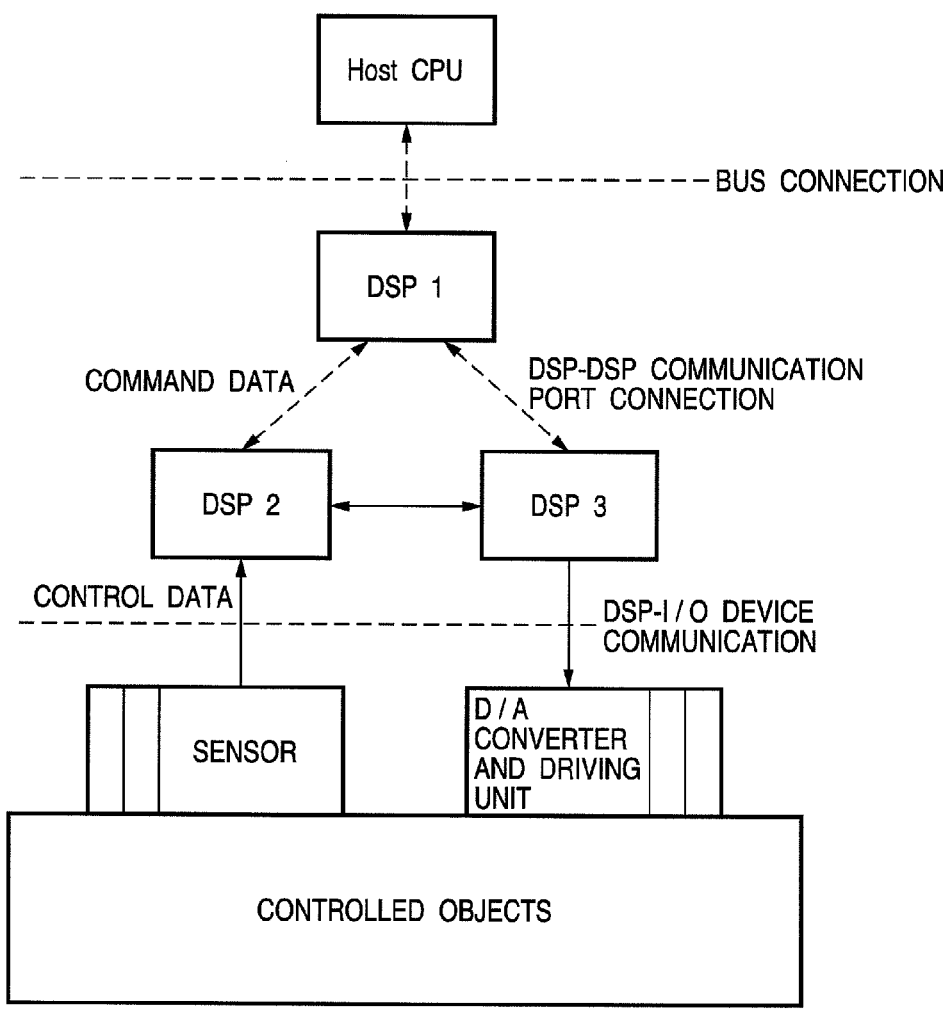
FIG. 1 shows an exemplary configuration of a conventional digital control system in an exposure apparatus using multiple DSPs.
Figure 2:
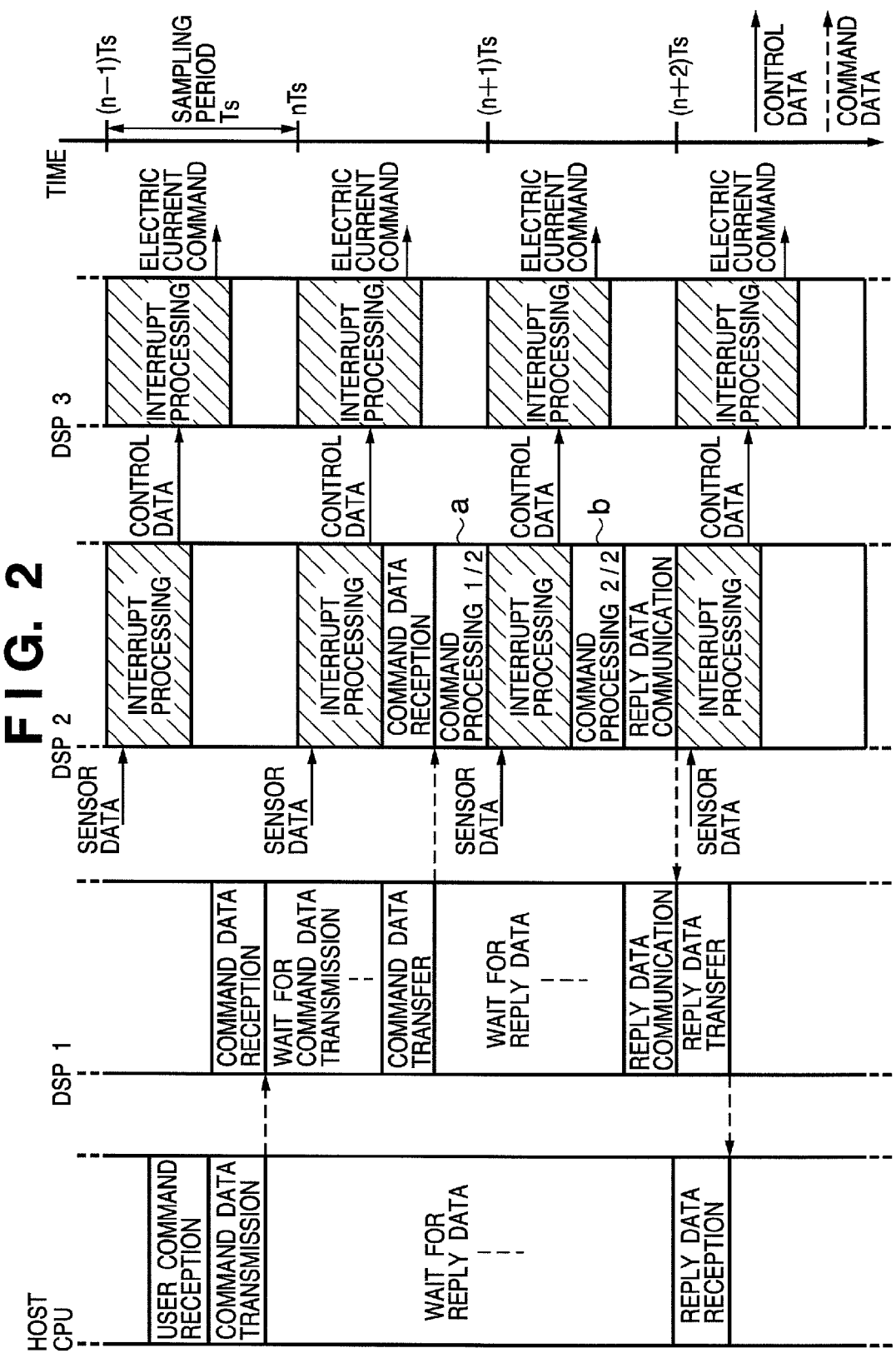
FIG. 2 shows timing of data communication and computation processing performed by processors according to the conventional art described with reference to FIG. 1.
Figure 3A:
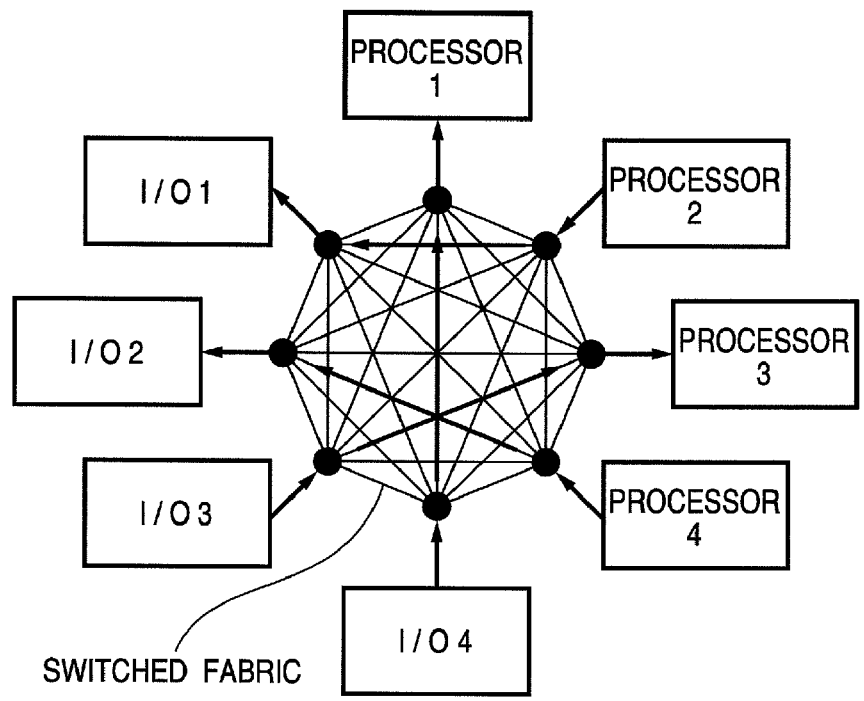
FIGS. 3A and 3B show an exemplary communication topology using a switched-fabric switching circuit.
Figure 3B:
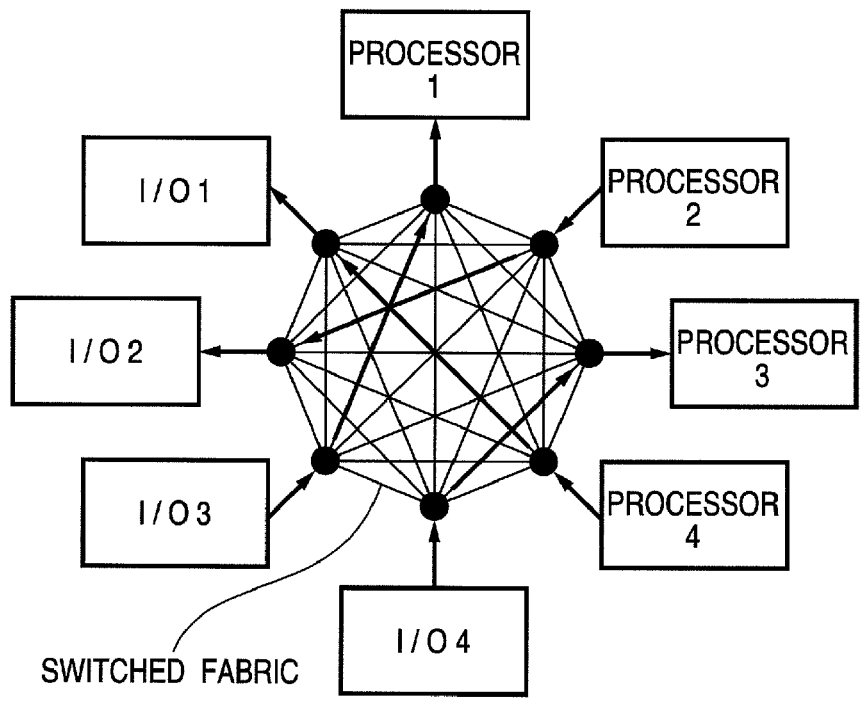
Figure 4B:
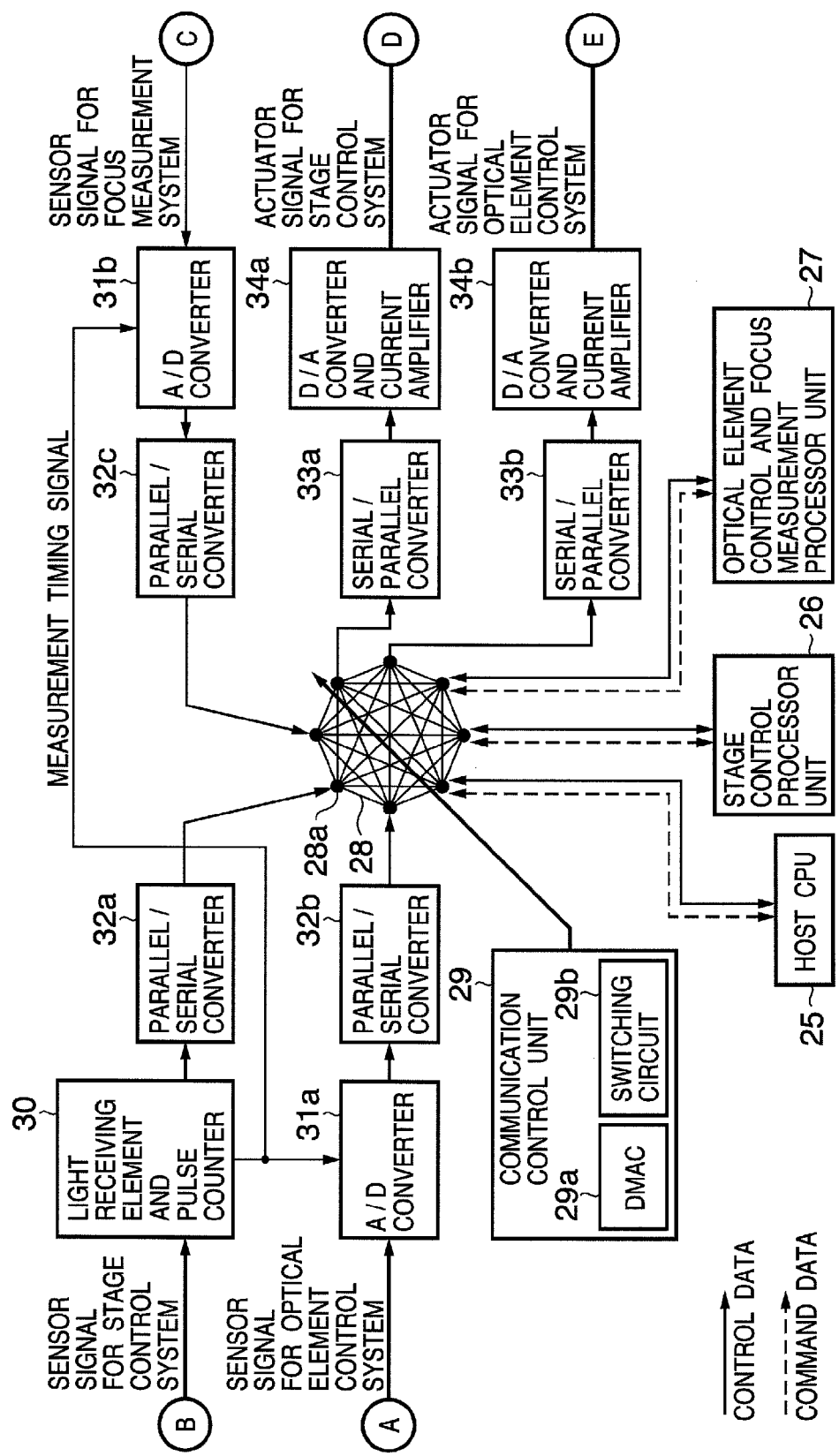

FIGS. 4A and 4B are block diagrams showing a configuration of an exposure apparatus and a digital control system according to the present invention.

In FIG. 4A, reference numeral 1 denotes a main structure of the exposure apparatus, reference numeral 2 denotes a vibration-free table for a projection lens and optical alignment system, reference numerals 3a and 3b denote wafer coarse moving stages, 4a and 4b denote wafer fine moving stages, and 5a and 5b denote linear motors that drive the wafer coarse moving stages.

Reference numerals 6a and 6b denote linear motors that drive the wafer fine moving stages, and 7a and 7b denote interferometer mirrors reflecting a laser beam for measuring the positions of the wafer coarse moving stages 3a and 3b. Reference numerals 8a and 8b denote interferometer mirrors reflecting a laser beam for measuring the positions of the wafer fine moving stages 4a and 4b.

Reference numerals 9a and 10a denote interferometers that emit a laser beam for measuring the positions of the wafer stages 3a and 4a in an exposure station and 9b and 10b denote interferometers that emit a laser beam for measuring the positions of the wafer stages 3b and 4b in a measurement station.

Reference numerals 11a and 11b denote wafers, 12 denotes a reticle coarse moving stage, 13 denotes a reticle fine moving stage, 14 denotes a linear motor that drives the reticle coarse moving stage 12, and 15 denotes a linear motor that drives the reticle fine moving stage 13.

Reference numeral 16 denotes an interferometer mirror that reflects a laser beam for measuring the position of the reticle coarse moving stage 12, 17 denotes an interferometer mirror that reflects a laser beam for measuring the position of the reticle fine moving stage 13, and 18 denotes an interferometer that emits a laser beam for measuring the position of the reticle coarse moving stage 12.

Reference numeral 19 denotes an interferometer that emits a laser beam for measuring the position of the reticle fine moving stage 13, and 20 denotes a reticle bearing a circuit pattern.

Reference numerals 21a and 21b denote projection lenses and 22a and 22b denote gap sensors that measure the gap between the projection lenses 21a and 21b. Reference numerals 23a and 23b denote actuators that drive the projection lenses 21a and 21b, and 24 denotes a lens barrel of the projection optical system, and 35 and 36 denote a light emitting element and a light receiving element of a wafer-surface focus detecting system.

In FIG. 4B, reference numeral 25 denotes a host CPU, 26 denotes a stage control processor unit, 27 denotes an optical element control and focus measurement processor unit, and 28 denotes a switched-fabric switching circuit.

Reference numeral 29 denotes a communication control unit. The communication control unit 29 includes a circuit 29b for switching connections on a switched fabric 28 and a DMA controller 29a for data communication.

Reference numeral 30 denotes a light receiving element and a pulse counter, 31a and 31b denote A/D converters, 32a-32c denote parallel/serial converters and 33a and 33b denote serial/parallel converters.

Reference numerals 34a and 34b denote D/A converter and current amplifiers.

<Control of the Exposure Apparatus>

Control operation of the exposure apparatus according to the first embodiment will be described below.

In FIG. 4A, constant-rate scan control is performed between the wafer 11a placed on the wafer stages 3a and 4a located in the exposure station (the section including the projection optical system lens barrel 24) and the reticle 20 placed on the stages 12 and 13. Scan exposure is performed while keeping synchronization between the wafer 11a and the reticle 20.

The positions of the stages are controlled as follows. The interferometer mirrors 7a, 8a, 16, and 17 are irradiated with a laser beam. Coherent light produced through interference caused by the interferometers 9a, 10a, 18, and 19 is guided to the light receiving element and to a pulse counter and is measured as positional information. It is then guided to the stage control processor unit 26, where computation processing is performed. The result of the computation processing is provided as a command electric current to the linear motors 3a, 4a, 12, and 13 of the stages through the D/A converter and current amplifier 34a. Thus, a servo system is formed.

The attitudes of the projection lenses 21a and 21b are fine-adjusted in order to reduce aberration. In particular, variations in the positions are measured by the gap sensors 22a and 22b supported by the projection optical system lens barrel 24 and are provided through the A/D converter 31a to the optical element control and focus measurement processor unit 27, where servo computation processing is performed. The result of the computation is provided as a command current to the lens driving actuators 23a and 23b through the D/A converter and current amplifier 34b.

In parallel with the exposure operation in the exposure station, the wafer stages 3b and 4b in the measurement station (the section under the wafer-surface-focus detecting systems 35, 36) perform scanning and stepping. During this operation, the focuses on the entire surface of wafer and alignment are measured.

<Timing of Data Transfer and Computation Processing>

Figure 5:
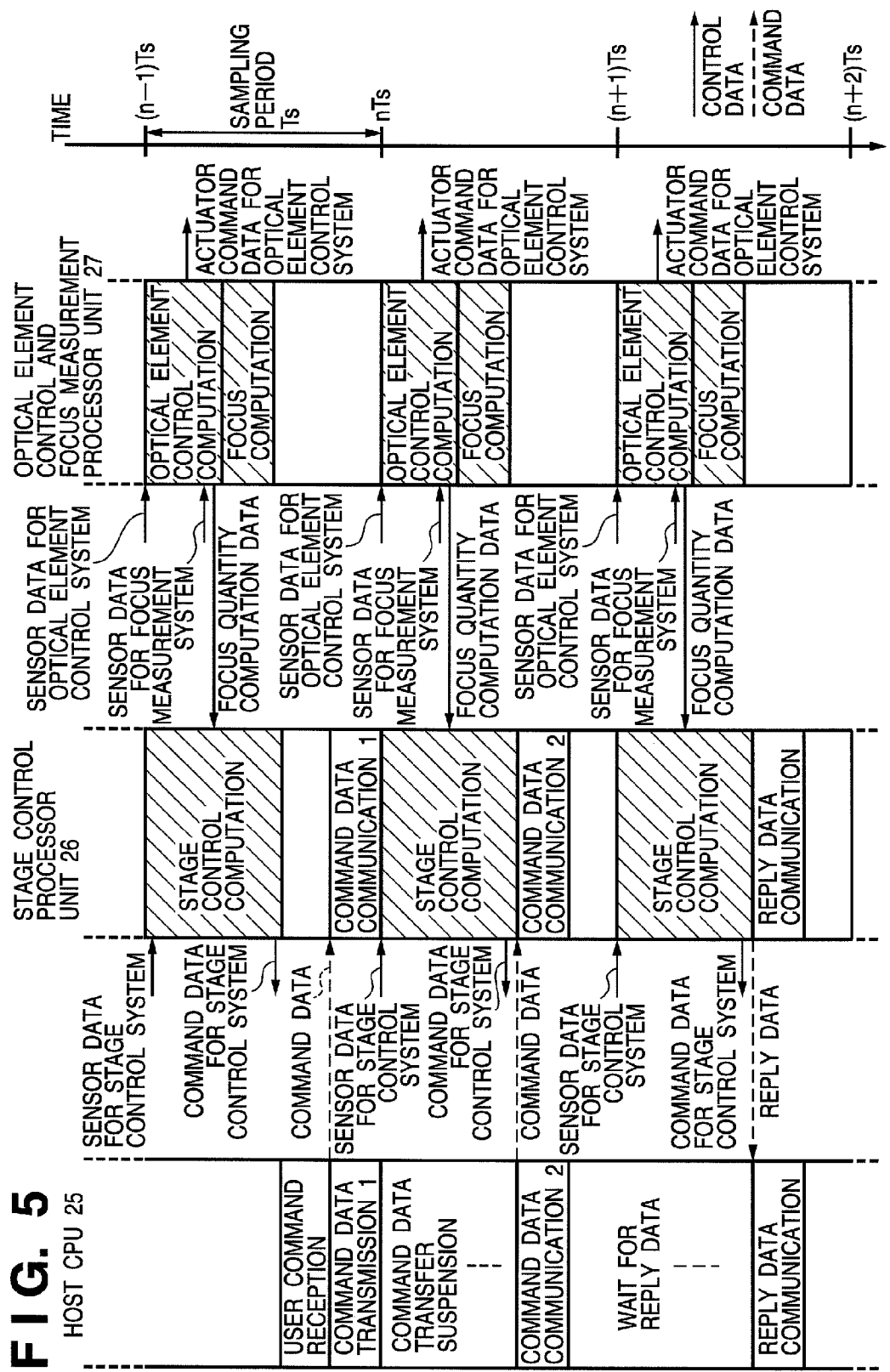
FIG. 5 shows timing of data communication and computation processing by processors in an exposure apparatus and a digital control system according to an embodiment.
Figure 6:
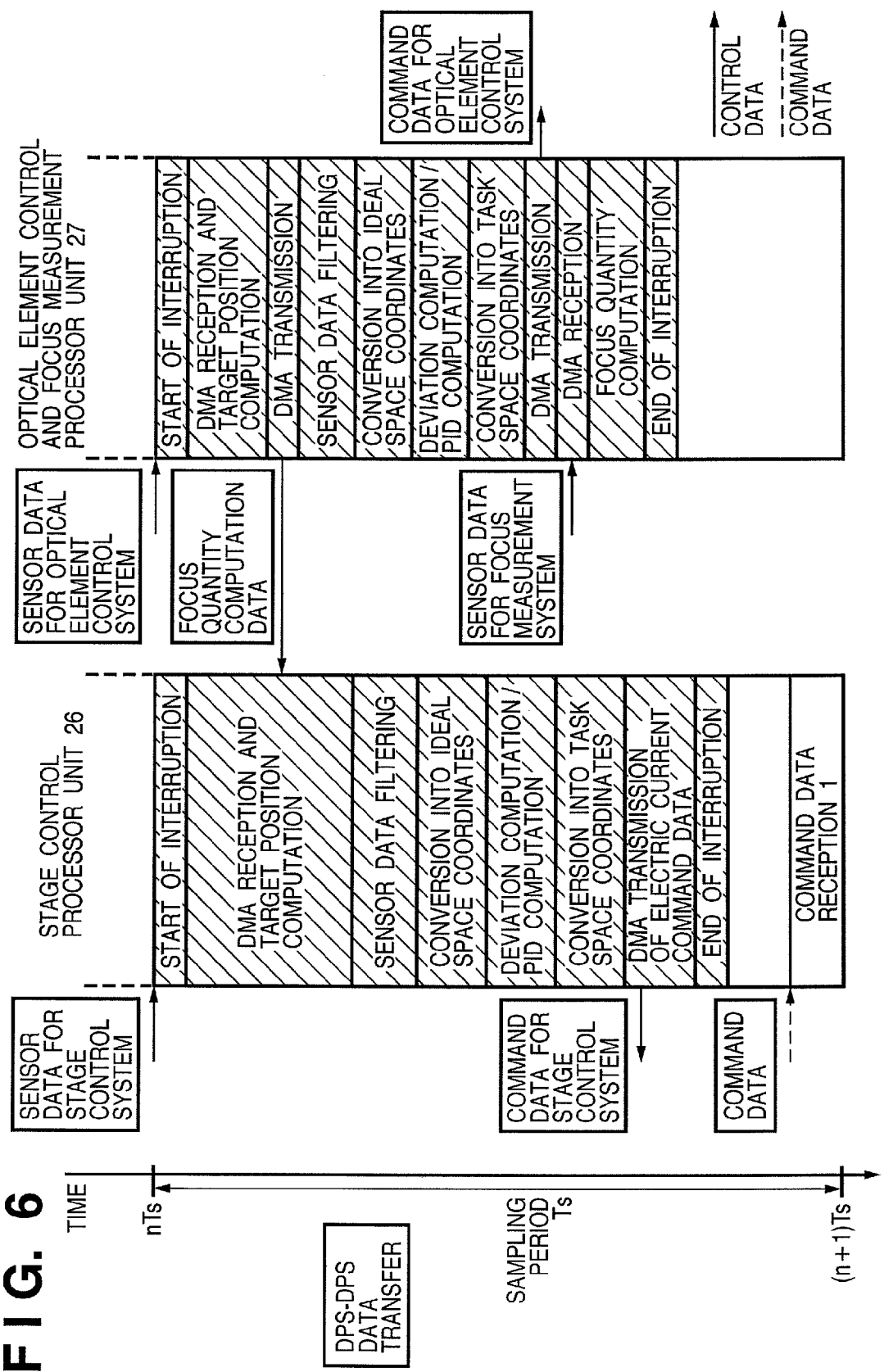
FIG. 6 shows timing of control interrupt processing in a stage control processor unit and an optical element control and focus measurement processor unit.

FIG. 5 shows timing of data communication and computation processing by the processors in the exposure apparatus and the digital control system according to the first embodiment. FIG. 6 shows timing of control interrupt processing in the stage control processor unit 26 and the optical element control and focus measurement processor unit 27. Operation of the digital control system including the switched fabric 28 will be described with reference to FIGS. 4A, 4B, 5, and 6.

A measurement timing signal is generated by the light receiving element and pulse counter 30 for each sampling period and data are measured for all sensors, including sensors not shown, simultaneously. This simultaneousness of sensor measurements is an essential technique for achieving an accurate synchronization control of the stage positions in scanner-type exposure apparatuses and can be accomplished by using a well known technique (see Japanese Patent Laid-Open No. 2000-228342 for example).

The simultaneously measured data are provided through the A/D converters 31a and 31b to the parallel/serial converters 32a-32c, where they are converted into serial data, and then provided onto the switched fabric 28.

Among the measured data, the data obtained from the interferometers 18 and 19 and the light receiving element 36 are transferred to the stage control processor unit 26 through DMA transfer. The measured data obtained from the gap sensors 22a and 22b are transferred to the optical element control and focus measurement processor unit 27 through DMA transfer.

The stage control processor unit 26 performs processing such as denoising filtering and coordinate space conversion based on the information about the position of the stages obtained and calculates a state quantity in an independent space coordinate system. The stage control processor unit 26 also calculates the deviations from target positions, which are generated as time functions, performs control calculation such as PID calculation to obtain a command value in the independent coordinate system.

The obtained command value in the independent coordinate system is converted into a command value in a task coordinate system which is dependent on the arrangement of the actuators. The command current indicating the command value is provided to the serial/parallel converter 33a and the D/A converter and current amplifier 34a through the switched fabric 28, and drives the linear motor of each stage.

Similarly, the optical element control and focus measurement processor unit 27 calculates a command value to be provided to each actuator. The command current indicative of the command value is provided to the serial/parallel converter 33b and the D/A converter and current amplifier 34b through the switched fabric 28, and drives each actuator.

The data on the focus on the wafer surface is provided to the optical element control and focus measurement processor unit 27 and the profile of the entire surface of the wafer is measured. The information about the profile of the wafer surface is used as data for controlling the attitude of the wafer during exposure in the exposure station.

The flow of command processing will be described below. The host CPU 25 receives a command such as a command for changing a PID parameter or a command for stepping to a control target.

The command is transferred to the stage control processor unit 26 or the optical element control and focus measurement processor unit 27, and the command processing is executed in that processor unit.

When the control data communication or the command data communication stated above is performed, the switched fabric 28 dynamically switches connections. This switching enables the processor units 26 and 27 to connect to different elements and perform control data communication and command data communication to perform control processing.

As mentioned above, a sampling period for digital control computation is on the order of several hundred microseconds. In the conventional art, data are transferred through DMA basically without interruption and without involvement of processing by processors once the transfer is started. Therefore, if the start timing of control data transfer is reached while command data is being transferred through DMA transfer, the switched fabric 28 cannot change the connection. As a result, the timing of starting control data communication is delayed and periodic digital control cannot be performed. That is, the hard realtime capability is impaired.

Therefore, according to the first embodiment, the communication control unit 29 that controls the switched fabric 28 is provided. The communication control unit 29 includes a DMA controller 29a (hereinafter abbreviated as DMAC) and a switching circuit 29b.

The communication control unit 29 is capable of assigning priorities to the types of data to be transferred through the switched fabric 28. In the first embodiment, a higher priority is assigned to control data communication than that of command data communication.

During command data communication, the DMAC 29a of the communication control unit 29 constantly polls each node to check if an additional data transfer request is issued from the node. In particular, the DMAC 29a performs polling to check whether the header of a data transfer packet, which will be described later, from any of the nodes has arrived. If arrived, the DMAC 29a checks the priority of the transfer to determine whether the transfer request should be executed first.

If the next sampling period is reached during DMA transfer of command data, the stage control processor unit 26 or the optical element control and focus measurement processor unit 27 issues a transfer request to the DMAC 29a. DMAC 29a confirms the priority of the data to be transferred according to the transfer request. Here, the priority of control data is higher than that of command data. Accordingly, the DMAC 29a interrupt the command data communication. Then, the switching circuit 29b changes the connection of the switched fabric 28 so that the control data communication can be performed.

On the completion of the control data communication, the stage control processor unit 26 or the optical element control and focus measurement processor unit 27 notifies the communication control unit 29 of the completion of the control data communication. When the communication control unit 29 receives the notification, the switching circuit 29b changes the connection of the switched fabric 28 so that command communication can be performed, and then the DMAC 29a resumes the command data communication from where it suspended the command data communication.

Operation of the switched fabric 28 will be described in further detail. The processor units 26, 27 and I/O devices 28a perform communication through the switched fabric 28. A packet data with header information including destination information, source information, and transfer priority information is added to data to be transferred. The data is then sent onto the switched fabric 28 and is received by the DMAC 29a. The DMAC 29a identifies communication having the highest priority from header information, and then communicate the main body of the data. Before DMAC 29a starts communication, the switching circuit 29b changes the connection of the switched fabric 28 if necessary. The switched fabric 28 is typically implemented by a fast logic device such as an FPGA and therefore performs fast processing.

The priority based on the type of data communication is set in the communication control unit 29 by each processor unit during the initialization of the digital control system.

Figure 7:
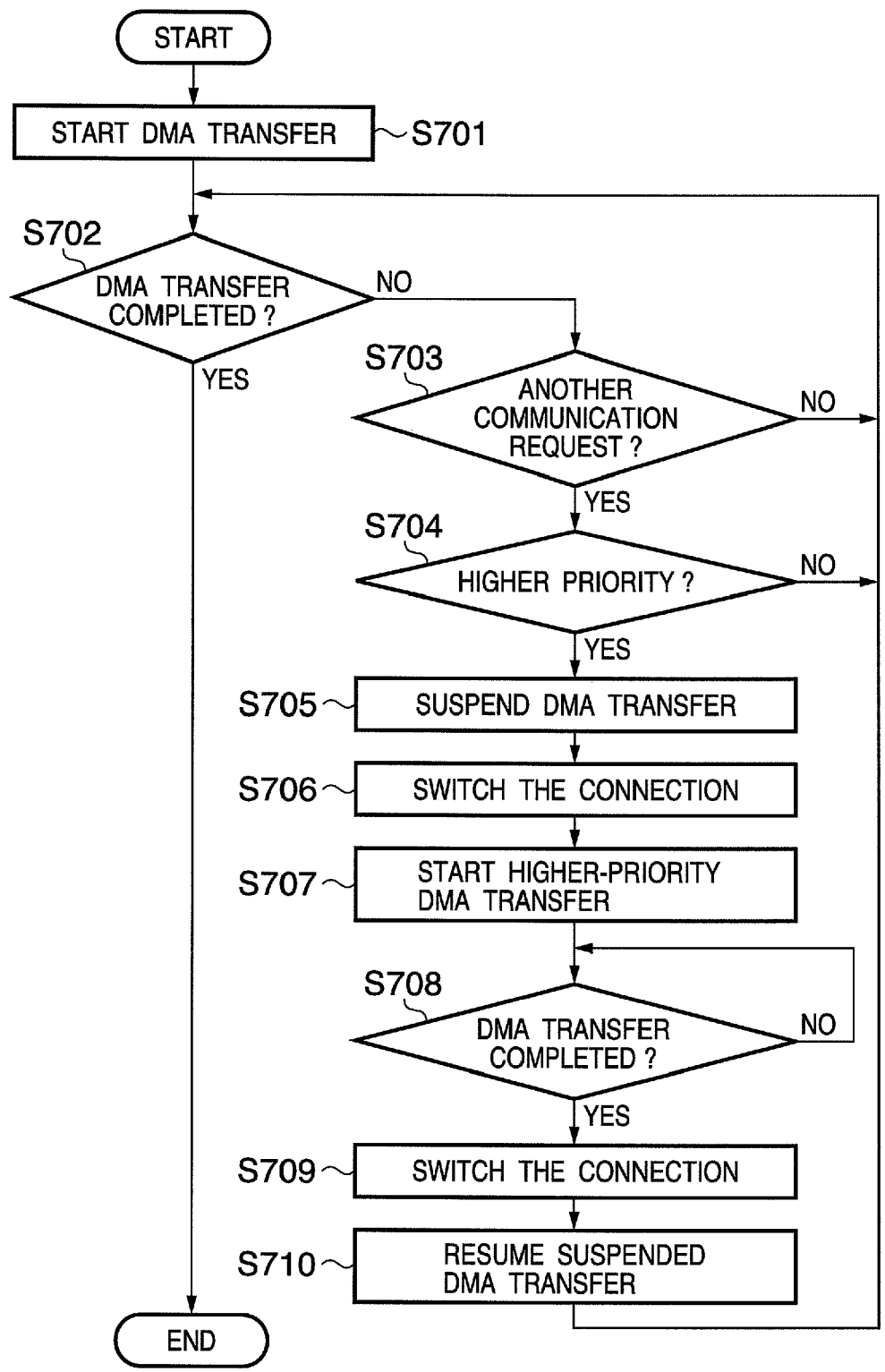
FIG. 7 is a flowchart illustrating a process flow in a communication control unit in generalized form.

FIG. 7 is a flowchart illustrating a generalized process flow in the communication control unit 29. Shown in FIG. 7 is a flow of process in the communication control unit 29 performed when a DMA transfer request is issued while data with a lower priority is transferred using DMA transfer through the switched fabric 28.

At step S701, the communication control unit 29 starts DMA transfer through the switched fabric 28. In the DMA transfer, the communication control unit 29 polls after each transmission of a predetermined amount of data and receives a transfer request from another communication node (for example the stage control processor unit 26).

At step S702, the communication control unit 29 determines whether the DMA transfer has been completed. If completed, the process will end; otherwise, the process proceeds to step S703.

At step S703, the communication control unit 29 determines whether it has received a transfer request from another communication node. If so, the process proceeds to step S704; otherwise, the DMA transfer is continued and then the process returns to step S702.

At step S704, the communication control unit 29 checks the priority of the data to be transferred according to the transfer request received at step S703. If the priory of the data is higher than that of the data that are currently being transferred, the communication control unit 29 proceeds to step S705. If the priority of the data is lower than that of the data currently being transferred, the communication control unit 29 continues the DMA transfer and returns to step S702.

At step S705, the communication control unit 29 interrupts the current DMA transfer.

At step S706, the communication control unit 29 switches the connection of the switched fabric 28 so that the data to be transferred according to the transfer request at step S703 can be transferred.

At step S707, the communication control unit 29 starts DMA transfer according to the transfer request received at step S703.

At step S708, the communication control unit 29 waits for the completion of the DMA transfer started at step S707.

At step S709, the communication control unit 29 returns the connection of the switched fabric 28 switched at step S706 to the previous state.

At step S710, the communication control unit 29 resumes the DMA transfer suspended at step S705, and then returns to step S702.

As has been described, according to the first embodiment, the communication control unit 29 holds priorities based on the types of data communication on the switched fabric 28. If the communication control unit 29 receives a request for data communication with a higher priority while the DMAC 29*a* of the communication control unit 29 is performing DMA transfer, the DMAC 29*a* suspends the DMA transfer. Then, the switching circuit 29*b* of the communication control unit 29 changes the connection of the switched fabric 28. On the completion of the higher-priority data communication, the switching circuit 29*b* of the communication control unit 29 returns the connection of the switched fabric 28 to the previous state and the DMAC 29*a* resumes the suspended data communication.

Thus, the hard realtime capability can be ensured even though fast data communication using the DMA transfer function is performed in the digital control system of the exposure apparatus.

Second Embodiment

A digital control system having a single switched fabric 28 has been described with respect to the first embodiment. A digital control system having an additional switched fabric 37 besides a switched fabric 28 will be described with respect to a second embodiment. In the first embodiment, optical element control and focus measurement are performed on a single processor unit 27. In the second embodiment, on the other hand, two switched fabrics are used and, accordingly, an increased number of processors can be connected to the switched fabrics, thus the processing speed can be increased.

Figure 8:
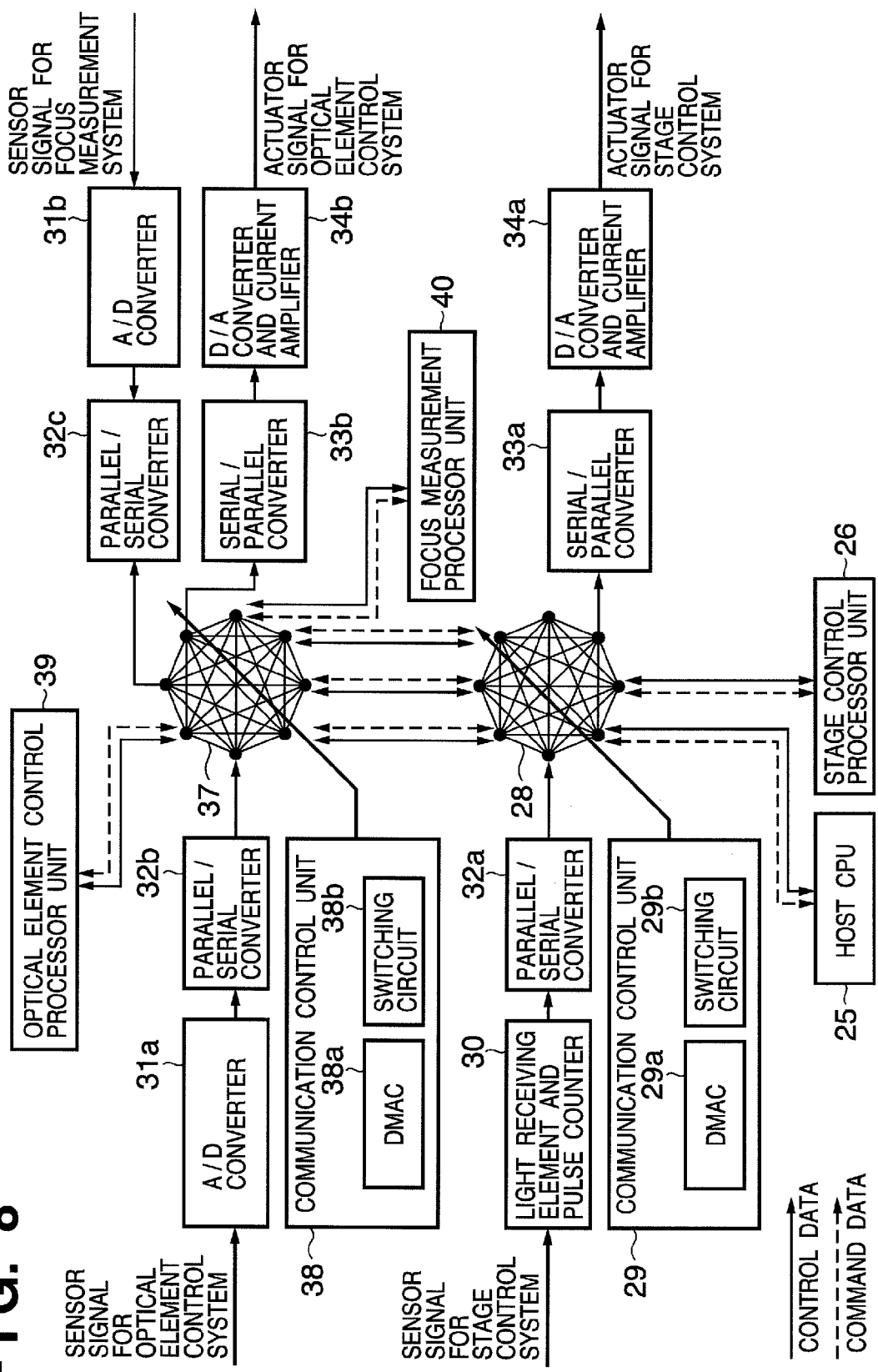
FIG. 8 shows a configuration of a digital control system according to a second embodiment.

FIG. 8 shows an exemplary configuration of a digital control system according to the second embodiment. The same components as those in the first embodiment (see FIGS. 4A and 4B) are labeled with the same reference numerals, the description of which will be omitted. The optical element control and focus measurement processor unit 27 is separated into two units, an optical element control processor unit 39 and a focus measurement processor unit 40, the functions of which are the same as the optical element control and focus measurement processor unit 27.

In the second embodiment, I/O devices of the optical element control system and the focus measurement system (parallel/serial converters 32*b*, 32*c* and a serial/parallel converter 33*b*) are connected to the switched fabric 37. The optical element control processor unit 39 and the focus measurement processor unit 40 separately perform parallel processing.

A communication control unit 38 which controls the switched fabric 37 is provided. Three connection lines are provided for data communication between the two switched fabrics in order to prevent a bottleneck in communication between the switched fabrics. Like the communication control unit 29, the communication control unit 38 includes a DMAC 38*a* and a switching circuit 38*b*.

As has been described, according to the present invention, two switched fabrics 28 and 37 are provided in the digital control system so that more processors can be provided in the digital control system.

Thus, the throughput of the digital communication system can be improved. Furthermore, because various I/O devices as well as processors can be connected onto the switched fabrics, a more scalable digital control system can be built.

It should be noted that the number of switched fabrics that can be provided in a digital control system is not limited to two. More than two fabrics may be provided.

Other Embodiment

The embodiments described above may be provided to a system or apparatus as a storage medium on which software program code that embodies the functions of any of the embodiments are recorded. A computer (or a CPU or MPU) of the system or apparatus can read and execute the program code stored on the storage medium to implement the functions of any of the embodiments described above. Then, the program code itself read from the storage medium implements the functions of any of the embodiments described above and the storage medium on which the program code is stored constitutes the present invention. The storage medium for supplying the program code may be a floppy (registered trademark) disk, a hard disk, an optical disk, or a magneto-optical disk. Alternatively, it may be a storage medium such as a CD-ROM, a CD-R, a magnetic tape, a non-volatile memory card, or a ROM.

The present invention includes not only the mode in which a computer reads and executes the program code to implement the functions of any of the embodiments described above but also include a mode in which an OS (Operating System) or other system running on a computer executes part or all of the actual processing according to instructions in the program code and the processing implements the functions of any of the embodiments described above.

The program code read from the storage medium may be loaded in a memory provided in a function expansion board inserted in the computer or a function expansion unit connected to the computer. Then, a CPU on the function expansion board or unit may perform part or all of actual processing according to instructions in the program code and the processing may implement the functions of any of the embodiments described above.

Figure 9:
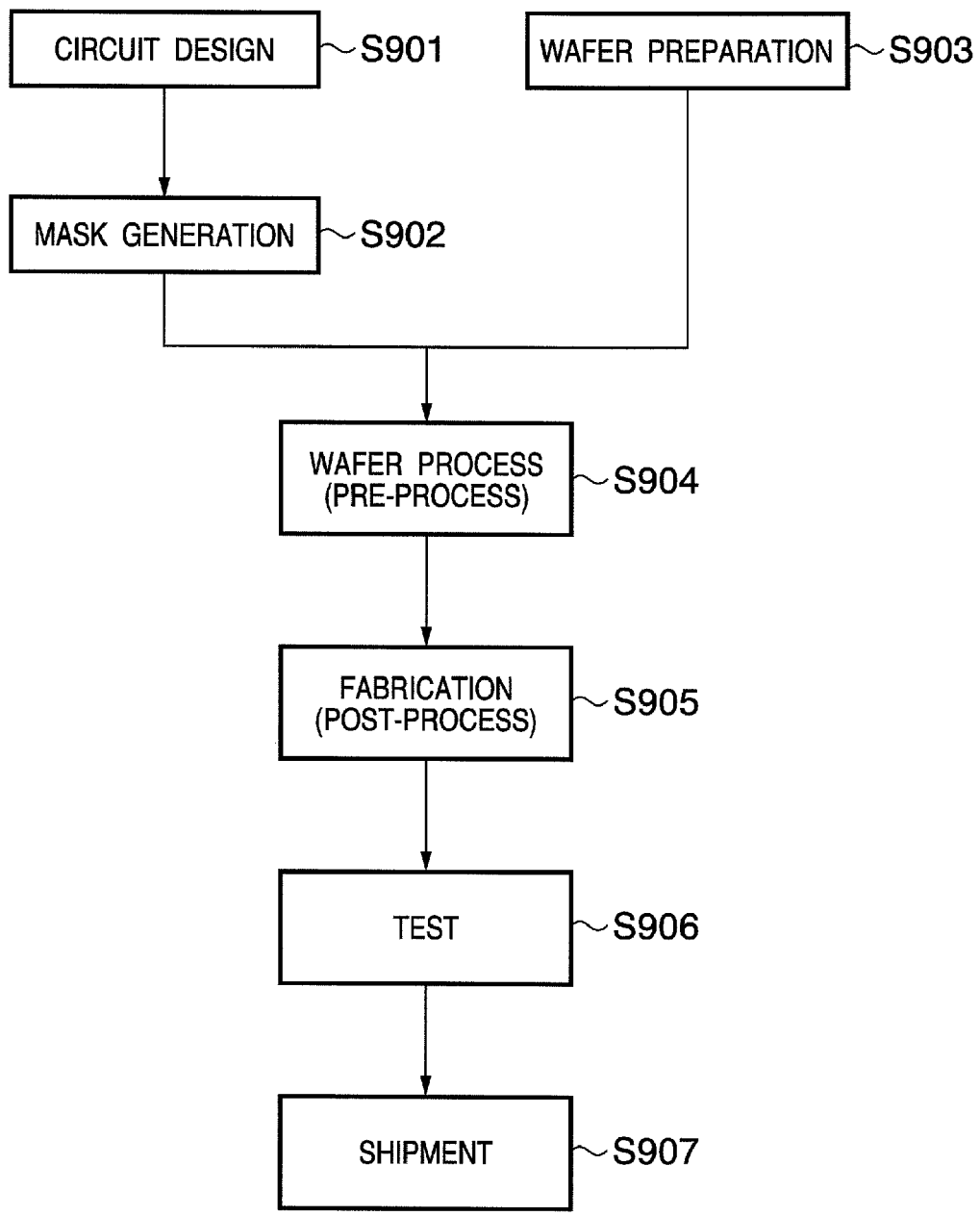
FIG. 9 is a flowchart illustrating a microdevice manufacturing process.
Figure 10:
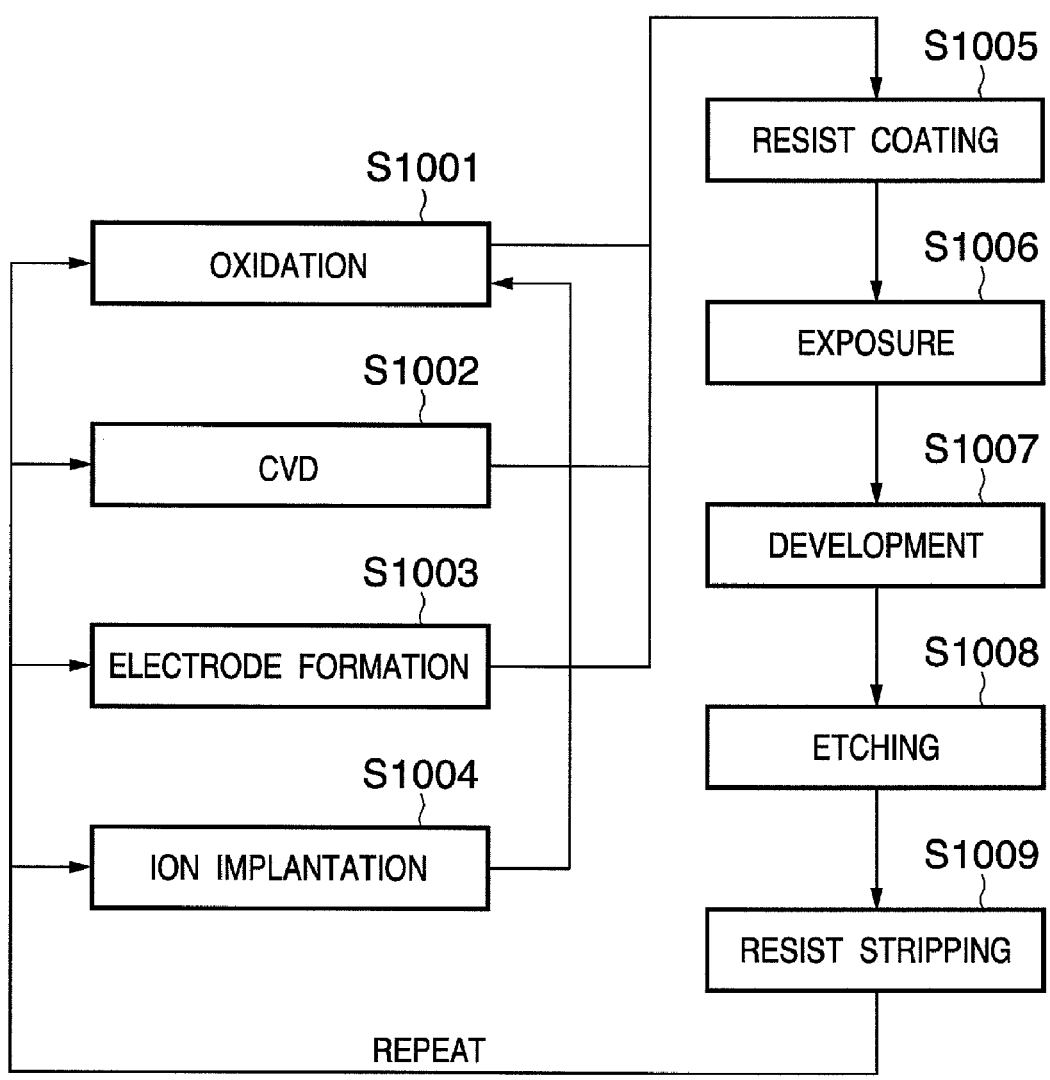
FIG. 10 is a flowchart illustrating a wafer process in detail.

With reference to FIGS. 9 and 10, an embodiment of a device manufacturing method using the above-describe exposure apparatus will be described below. FIG. 9 is a flowchart illustrating manufacturing of devices (semiconductor chips such as ICs and LSIs, or devices such as LCDs and CCDs). A method for manufacturing semiconductor chips will be described herein.

At step S901 (Circuit design), the circuitry of a semiconductor device is designed. At step S902 (Mask generation), a mask is made according to the circuit pattern designed. At step S903 (Wafer preparation), wafers are made from silicon. At step S904 (Wafer process), a process called the pre-process is performed in which actual circuitry is formed on the wafer through the mask by using the exposure apparatus and a lithography technique. Step S905 (Fabrication) is a process called the post-process, in which the wafer processed at step S904 is used to generate a semiconductor chip. The post-process includes fabrication processes such as an assembly process (dicing and bonding) and a packaging process (chip sealing). At step S906 (Testing), tests such as operation tests and durability tests are conducted on the semiconductor devices fabricated at step S905. Through these processes, the semiconductor devices are completed and then shipped (step S907).

FIG. 10 is a flowchart illustrating details of the wafer process at step S904. At step S1001 (Oxidization), the surface of the wafer is oxidized. At step S1002 (CVD), an insulator film is formed on the surface of the wafer. At step S1003 (Electrode formation), electrodes are formed through vapor deposition. At step S1004 (Ion implantation), ions are implanted in the wafer. At step S1005 (Resist coating), a photosensitive material is applied to the wafer. At step S1006 (Exposure), the circuit pattern of the mask is transferred to the wafer through exposure by using the exposure apparatus. At step S1007 (Development), the exposed wafer is developed. At step S1008 (Etching), parts other than the exposed resist image is removed. At step S1009 (Resist stripping), unnecessary resist remaining after the etching is removed. These steps are repeated to form circuit patterns on multiple layers on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2005-235491, filed Aug. 15, 2005, which is hereby incorporated by reference herein in its entirety.

What is claimed is:

1. A communication control apparatus in a control apparatus having a measurement unit which measures the position of a controlled object, a control processor which computes digital control data for controlling the controlled object according to measured data by the measurement unit, a driving unit which drives the controlled object according to the digital control data, and a host processor which sends command data corresponding to a predetermined command to the control processor; the communication control apparatus comprising:
    a switching unit, adapted to switch configuration of a communication circuit that is capable of providing at least two communication channels at the same time, depending on the configuration, between the measurement unit and the control processor, the control processor and the driving unit, or the control processor and the host processor;
    a transfer unit, adapted to transfer the measured data, the digital control data, and the command data through the communication channels provided by the communication circuit by way of Direct Memory Access (DMA) transfer;
    a setting unit, adapted to set, among data transferred through DMA transfer, a higher priority on data transferred at every predetermined sampling period than on data transferred regardless of the predetermined sampling period;
    a receiving unit, adapted to receive a DMA transfer request from at least one of the processors;
    a communication unit, adapted to initiate data communication through DMA transfer in response to the DMA transfer request;
    a comparing unit, adapted to, when a new DMA transfer request is received during the DMA transfer initiated by the communication unit, compares a priority of the data currently being transferred with a priority of data relating to the newly received DMA transfer request; and
    a transfer control unit, adapted to interrupts the DMA transfer of the data currently being transferred and initiates DMA transfer of new data relating to the newly received DMA transfer request, if a comparison by the comparing unit shows that the priority of the data relating to the newly received DMA transfer request is higher than the priority of the data currently being transferred,
    wherein the transfer control unit makes the switching unit switch the configuration of the communication circuit so that the transfer unit is capable of transferring said new data through a communication channel provided by the communication circuit.

2. The communication control apparatus according to claim 1, wherein the transfer control unit resumes the interrupted DMA transfer of the data being transferred after completion of the newly initiated DMA transfer of the new data.

3. The communication control apparatus according to claim 1, wherein communication circuit is provided by a switch-fabric communication circuit;
    wherein the switching unit comprises a switching circuit, adapted to switch the configuration of the switched-fabric communication circuit;
    wherein the transfer unit comprises a DMA controller, adapted to control the DMA transfer; and
    wherein the processors are connected to the switched-fabric communication circuit and an Input/Output device which connects the processors with the measurement unit and the driving unit is connected to the switched-fabric communication circuit.

4. The communication control apparatus according to claim 3, wherein a plurality of the processors and a plurality of Input/Output devices are connected to the switched-fabric communication circuit.

5. The communication control apparatus according to claim 3, wherein the communication circuit is provided by a plurality of the switched-fabric communication circuits;
    wherein the switching unit comprises a plurality of the switching circuit, each of which are for one of the plurality of the switched-fabric communication circuits; and
    wherein the transfer unit comprises a plurality of the DMA controllers, each of which are for one of the plurality of the switched-fabric communication circuits.

6. An exposure apparatus comprising:
    a communication control apparatus according to claim 1;
    a projection optical system, adapted to project a pattern from a original onto a substrate and transfers the pattern onto the substrate through exposure; and
    a stage apparatus, adapted to move and position the original and the substrate relatively to each other; wherein
    an exposure station, adapted to transfer the pattern from the original onto the substrate through exposure, and a measurement station, adapted to measure positions of the projection optical system and the stage apparatus, are separately provided;
    data measured in the measurement station is transferred to the control processor through Direct Memory Access (DMA) transfer; and
    the control processor computes control data for controlling the exposure station by using the measured data.

7. An exposure apparatus according to claim 6, wherein the control processor comprises a processor which controls the stage apparatus and a processor which controls the projection optical system.

8. A device manufacturing method comprising the steps of:
    exposing a wafer using an exposure apparatus according to claim 6; and developing the wafer.

9. A communication control method in a control apparatus having a measurement unit which measures the position of a controlled object, a control processor which computes digital control data for controlling the controlled object according to measured data by the measuring unit, a driving unit which drives the controlled object according to the digital control data, and a host processor which sends command data corresponding to a predetermined command to the control processor; the communication control method comprising:
    a switching step of switching configuration of a communication circuit that is capable of providing at least two communication channels at the same time, depending on the configuration, between the measurement unit and the control processor, the control processor and the driving unit, or the control processor and the host processor;
    a transfer step of transferring the measured data, the digital control data, and the command data through the communication channels provided by the communication circuit by way of Direct Memory Access (DMA) transfer;

a setting step of setting, among data transferred through DMA transfer, a higher priority on data transferred at every predetermined sampling period than on data transferred regardless of the predetermined sampling period;

a receiving step of receiving a DMA transfer request from at least one of the processors;

a communication step of initiating data communication through DMA transfer in response to the DMA transfer request;

a comparing step of, when a new DMA transfer request is received during the DMA transfer initiated in the communication step, comparing a priority of the data currently being transferred with a priority of data relating to the newly received DMA transfer request; and a transfer control step of interrupting the DMA transfer of the data currently being transferred and initiating DMA transfer of new data relating to the newly received DMA transfer request, if a comparison in the comparing step shows that the priority of the data relating to the newly received DMA transfer request is higher than the priority of the data currently being transferred, wherein the transfer control step makes the switching step switch the configuration of the communication circuit so that the transfer step is capable of transferring said new data through a communication channel provided by the communication circuit.

10. A computer program, stored in a computer-readable storage medium, executed by a communication control unit, wherein the communication control unit is provided in a control apparatus having a measurement unit which measures a position of a controlled object, a control processor which computes digital control data for controlling the controlled object according to measured data by the measuring unit, a driving unit which drives the controlled object according to the digital control data, and a host processor which sends command data corresponding to a predetermined command to the control processor; the computer program comprising:

a switching step module, adapted to switch configuration of a communication circuit that is capable of providing at least two communication channels at the same time, depending on the configuration, between the measurement unit and the control processor, the control processor and the driving unit, or the control processor and the host processor;

a transfer step module, adapted to transfer the measured data, the digital control data, and the command data through the communication channels provided by the communication circuit by way of Direct Memory Access (DMA) transfer;

a setting step module, adapted to set, among data transferred through DMA transfer, a higher priority on data transferred at every predetermined sampling period than on data transferred regardless of the predetermined sampling period;

a receiving step module, adapted to receive a DMA transfer request from at least one of the processors;

a communication step module, adapted to initiate data communication through DMA transfer in response to the DMA transfer request;

a comparing step module, adapted to, when a new DMA transfer request is received during the DMA transfer initiated by the communication step module, compare a priority of the data currently being transferred with a priority of data relating to the newly received DMA transfer request; and a transfer control step module, adapted to interrupt the DMA transfer of the data currently being transferred and initiate DMA transfer of new data relating to the newly received DMA transfer request, if a comparison by the comparing step module shows that the priority of the data relating to the newly received DMA transfer request is higher than the priority of the data currently being transferred, wherein the transfer control step module makes the switching step module switch the configuration of the communication circuit so that the transfer step module is capable of transferring said new data through a communication channel provided by the communication circuit.

11. A computer-readable storage medium on which a computer program executed by a communication control circuit is stored, wherein the communication control unit is provided in a control apparatus having a measurement unit which measures a position of a controlled object, a control processor which computes digital control data for controlling the controlled object according to measured data by the measuring unit, a driving unit which drives the controlled object according to the digital control data, and a host processor which sends command data corresponding to a predetermined command to the control processor; the computer program comprising:

a switching step module, adapted to switch configuration of a communication circuit that is capable of providing at least two communication channels at the same time, depending on the configuration, between the measurement unit and the control processor, the control processor and the driving unit, or the control processor and the host processor;

a transfer step module, adapted to transfer the measured data, the digital control data, and the command data through the communication channels provided by the communication circuit by way of Direct Memory Access (DMA) transfer;

a setting step module, adapted to set, among data transferred through DMA transfer, a higher priority on data transferred at every predetermined sampling period than on data transferred regardless of the predetermined sampling period;

a receiving step module, adapted to receive a DMA transfer request from at least one of the processors;

a communication step module, adapted to initiate data communication through DMA transfer in response to the DMA transfer request;

a comparing step module, adapted to, when a new DMA transfer request is received during the DMA transfer initiated by the communication step module, compare a priority of the data currently being transferred with a priority of data relating to the newly received DMA transfer request; and a transfer control step module, adapted to interrupt the DMA transfer of the data currently being transferred and initiate DMA transfer of new data relating to the newly received DMA transfer request, if a comparison by the comparing step module shows that the priority of the data relating to the newly received DMA transfer request is higher than the priority of the data currently being transferred, wherein the transfer control step module makes the switching step module switch the configuration of the communication circuit so that the transfer step module is capable of transferring said new data through a communication channel provided by the communication circuit.

* * * * *